United States Patent
Fernando

(10) Patent No.: US 9,678,872 B2
(45) Date of Patent: Jun. 13, 2017

(54) MEMORY PAGING FOR PROCESSORS USING PHYSICAL ADDRESSES

(71) Applicant: Oracle International Corporation, Redwood City, CA (US)

(72) Inventor: John Fernando, Austin, TX (US)

(73) Assignee: Oracle International Corporation, Redwood Shores, CA (US)

( * ) Notice: Subject to any disclaimer, the term of this patent is extended or adjusted under 35 U.S.C. 154(b) by 70 days.

(21) Appl. No.: 14/598,371

(22) Filed: Jan. 16, 2015

(65) Prior Publication Data

US 2016/0210243 A1    Jul. 21, 2016

(51) Int. Cl.
  *G06F 12/08* (2016.01)
  *G06F 12/0811* (2016.01)
  *G11C 11/406* (2006.01)
  *G06F 12/1009* (2016.01)
  *G06F 12/123* (2016.01)
  *G06F 12/084* (2016.01)

(52) U.S. Cl.
  CPC ...... *G06F 12/0811* (2013.01); *G06F 12/1009* (2013.01); *G06F 12/123* (2013.01); *G11C 11/40615* (2013.01); *G06F 12/084* (2013.01); *G06F 2212/1024* (2013.01); *G06F 2212/65* (2013.01); *G06F 2212/69* (2013.01)

(58) Field of Classification Search
  CPC ............. G06F 12/1054; G06F 12/0811; G06F 12/0804; G06F 12/0806; G06F 3/0628; G06F 3/0631
  See application file for complete search history.

(56) References Cited

U.S. PATENT DOCUMENTS

| | | | | |
|---|---|---|---|---|
| 5,140,681 A | * | 8/1992 | Uchiyama | G06F 12/0815 365/189.14 |
| 5,361,340 A | * | 11/1994 | Kelly | G06F 12/1063 711/146 |
| 5,829,032 A | * | 10/1998 | Komuro | G06F 12/0813 711/117 |
| 6,088,770 A | * | 7/2000 | Tarui | G06F 12/0284 711/141 |
| 6,351,788 B1 | * | 2/2002 | Yamazaki | G06F 12/0864 711/118 |
| 6,510,496 B1 | * | 1/2003 | Tarui | G06F 12/0284 709/215 |

(Continued)

*Primary Examiner* — Jared Rutz
*Assistant Examiner* — Khoa D Doan
(74) *Attorney, Agent, or Firm* — Meyertons, Hood, Kivlin, Kowert & Goetzel, P.C.; Erik A. Heter

(57) ABSTRACT

A method and apparatus for memory paging is disclosed. A system includes a plurality of processor cores each configured to initiate requests to a memory by providing a physical address without a virtual address. A first cache subsystem is shared by each of a first subset of the plurality of processor cores. Responsive to receiving a memory access request from a processor core of the first subset, the first cache subsystem determines if a physical address of the request is in a first paged region of memory with respect to the first subset. If the physical address is in the paged region, the cache subsystem is configured to access a set of page attributes for a page corresponding to the physical address from a page attribute table responsive that is shared by each of the first subset of the plurality of processor cores.

20 Claims, 5 Drawing Sheets

(56) References Cited

U.S. PATENT DOCUMENTS

| | | | | |
|---|---|---|---|---|
| 7,496,713 B1* | 2/2009 | Ward | G06F 12/0831 | 711/141 |
| 7,669,011 B2* | 2/2010 | Conway | G06F 12/0815 | 711/124 |
| 8,799,553 B2 | 8/2014 | Hendry | | |
| 9,009,383 B2 | 4/2015 | Hendry | | |
| 9,098,417 B2* | 8/2015 | Loh | G06F 12/0842 | |
| 9,098,462 B1* | 8/2015 | McNicholl | G06F 13/1631 | |
| 9,128,625 B1 | 9/2015 | Ananthabhotla | | |
| 9,128,849 B2* | 9/2015 | Hendry | G06F 12/0831 | |
| 9,213,649 B2* | 12/2015 | Koka | G06F 12/1009 | |
| 9,311,011 B2* | 4/2016 | Gathala | G06F 3/0613 | |
| 9,336,413 B2* | 5/2016 | Jones | G06F 21/79 | |
| 2002/0052914 A1* | 5/2002 | Zalewski | G06F 9/5077 | 709/203 |
| 2006/0242368 A1* | 10/2006 | Huang | G06F 7/24 | 711/158 |
| 2006/0259681 A1* | 11/2006 | Rudelic | G06F 12/0886 | 711/103 |
| 2007/0143546 A1* | 6/2007 | Narad | G06F 12/084 | 711/130 |
| 2008/0028153 A1* | 1/2008 | Marwinski | G06F 12/084 | 711/130 |
| 2008/0229026 A1* | 9/2008 | Chung | G06F 12/0846 | 711/132 |
| 2009/0006718 A1* | 1/2009 | Blumrich | G06F 12/0804 | 711/103 |
| 2009/0083493 A1* | 3/2009 | Kinter | G06F 12/0831 | 711/141 |
| 2010/0235580 A1* | 9/2010 | Bouvier | G06F 12/084 | 711/129 |
| 2010/0268907 A1* | 10/2010 | Ouren | G06F 12/0802 | 711/170 |
| 2011/0072438 A1* | 3/2011 | Fiyak | G06F 9/3009 | 718/104 |
| 2012/0036412 A1* | 2/2012 | Sugawara | G06F 11/10 | 714/758 |
| 2012/0159082 A1* | 6/2012 | Cox | G06F 12/084 | 711/141 |
| 2012/0159103 A1* | 6/2012 | Peinado | G06F 12/126 | 711/163 |
| 2015/0100753 A1* | 4/2015 | Shen | G06F 12/1027 | 711/207 |
| 2016/0055086 A1* | 2/2016 | Fan | G06F 12/0848 | 711/121 |
| 2016/0092675 A1* | 3/2016 | Vidrine | G06F 21/52 | 726/22 |
| 2016/0162353 A1* | 6/2016 | Manohar | G06F 11/1048 | 714/760 |
| 2016/0170682 A1* | 6/2016 | Bakshi | G06F 3/0649 | 711/103 |

* cited by examiner

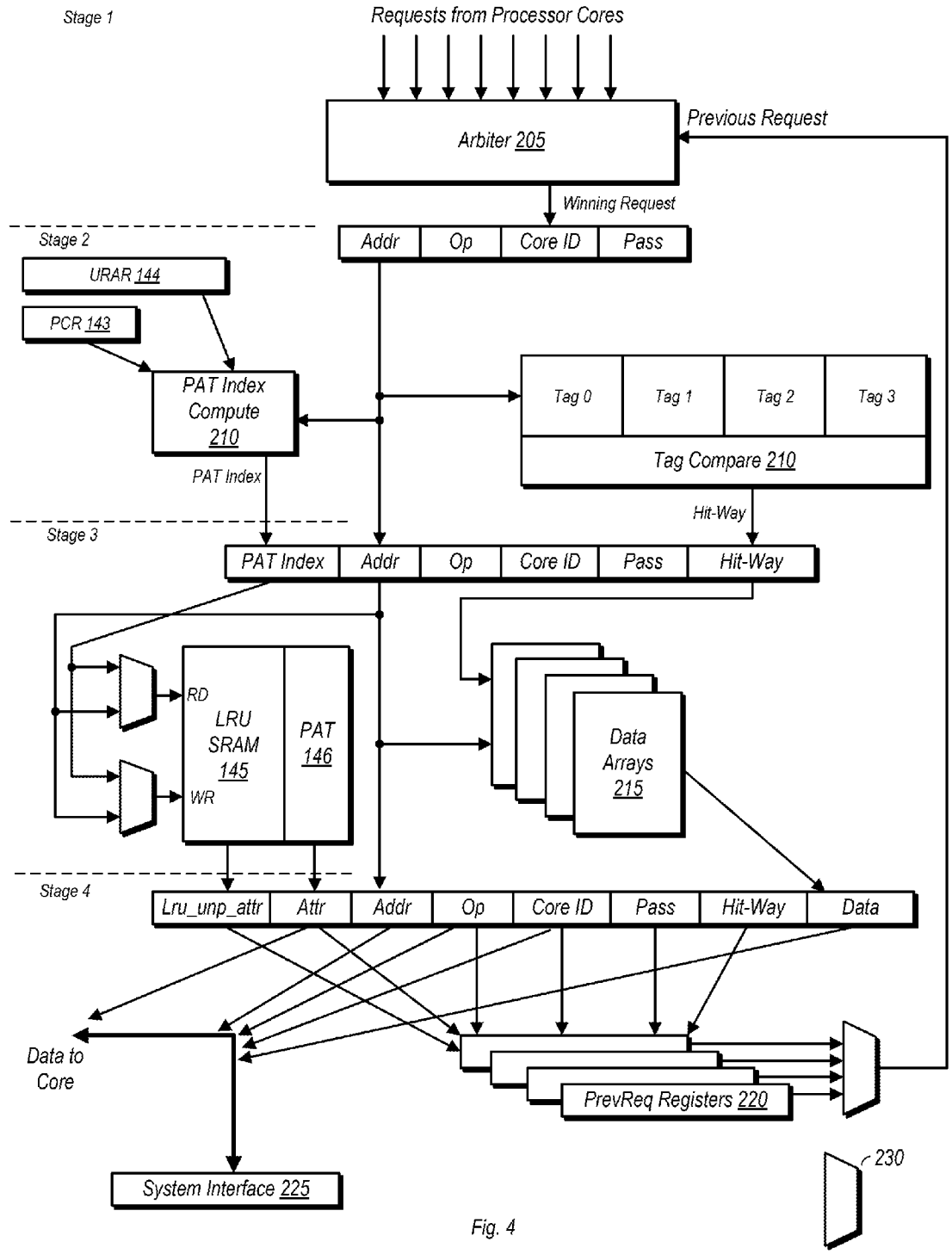
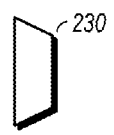
Fig. 4

MEMORY PAGING FOR PROCESSORS USING PHYSICAL ADDRESSES

BACKGROUND

1. Technical Field

This disclosure relates to processors, and more particularly, to processors that use physical addresses (no virtual addresses).

2. Description of the Related Art

Most modern computer systems use a scheme known as paging in the implementation of memory management. When using paging, a computer loads data into main memory in equally sized blocks known as pages. When paging is used, programs and data may be stored in non-contiguous physical address spaces. This in turn allows for more efficient utilization of the main memory.

During the operation of paged systems, a processor may provide virtual addresses when issuing memory access requests. The virtual addresses may then be translated into physical addresses prior to the actual request being performed. Virtual-to-physical address translations may typically be found in a page table that is stored in the main memory. Some processors may also include a structure known as a translation lookaside buffer (TLB) that can store a limited number of virtual-to-physical address translations that may be more frequently used or more recently accessed. The implementation of these structures in a processor may provide for faster access to a translation, and thus overall faster memory accesses.

SUMMARY OF THE DISCLOSURE

A method and apparatus for memory paging for processors using physical address is disclosed. In one embodiment, a system includes a plurality of processor cores each configured to initiate access requests to a system memory by providing a physical address. The system further includes a first cache subsystem including a cache memory, wherein the cache subsystem is shared by each of a first subset of the plurality of processor cores. Responsive to receiving a memory access request from one of the first subset of the plurality of processor cores, the first cache subsystem is configured to determine if the physical address of the memory access request is in a first paged region of memory with respect to the first subset of the plurality of processor cores. If the physical address is in the paged regions, the cache subsystem is configured to access a set of page attributes for a page corresponding to the physical address from a page attribute table responsive that is shared by each of the first subset of the plurality of processor cores.

In one embodiment, a method comprises a first one of a plurality of processor cores issuing a request for access to a system memory. The first one of the plurality of processor cores is one of a first subset of the plurality of processor cores, the first plurality of processor cores including a plurality of subsets including the first subset, wherein issuing the memory request comprises providing a physical memory address. The method further comprises determining, in a first cache subsystem, if the physical memory address corresponds to an address within a region of system memory appearing as a paged region to each processor core of the first subset. The first cache subsystem is shared by each processor core of the first subset. Responsive to determining that the physical memory address is in the paged region, the method comprises accessing a page attributes table to determine a set of attributes for a page corresponding to the physical memory address, wherein the paged attribute table is shared by each processor core of the first subset.

BRIEF DESCRIPTION OF THE DRAWINGS

Other aspects of the disclosure will become apparent upon reading the following detailed description and upon reference to the accompanying drawings which are now described as follows.

FIG. 4 is a block diagram illustrating operation and implementation of one embodiment of a system utilizing paging for cores producing physical addresses.

Figure 1:
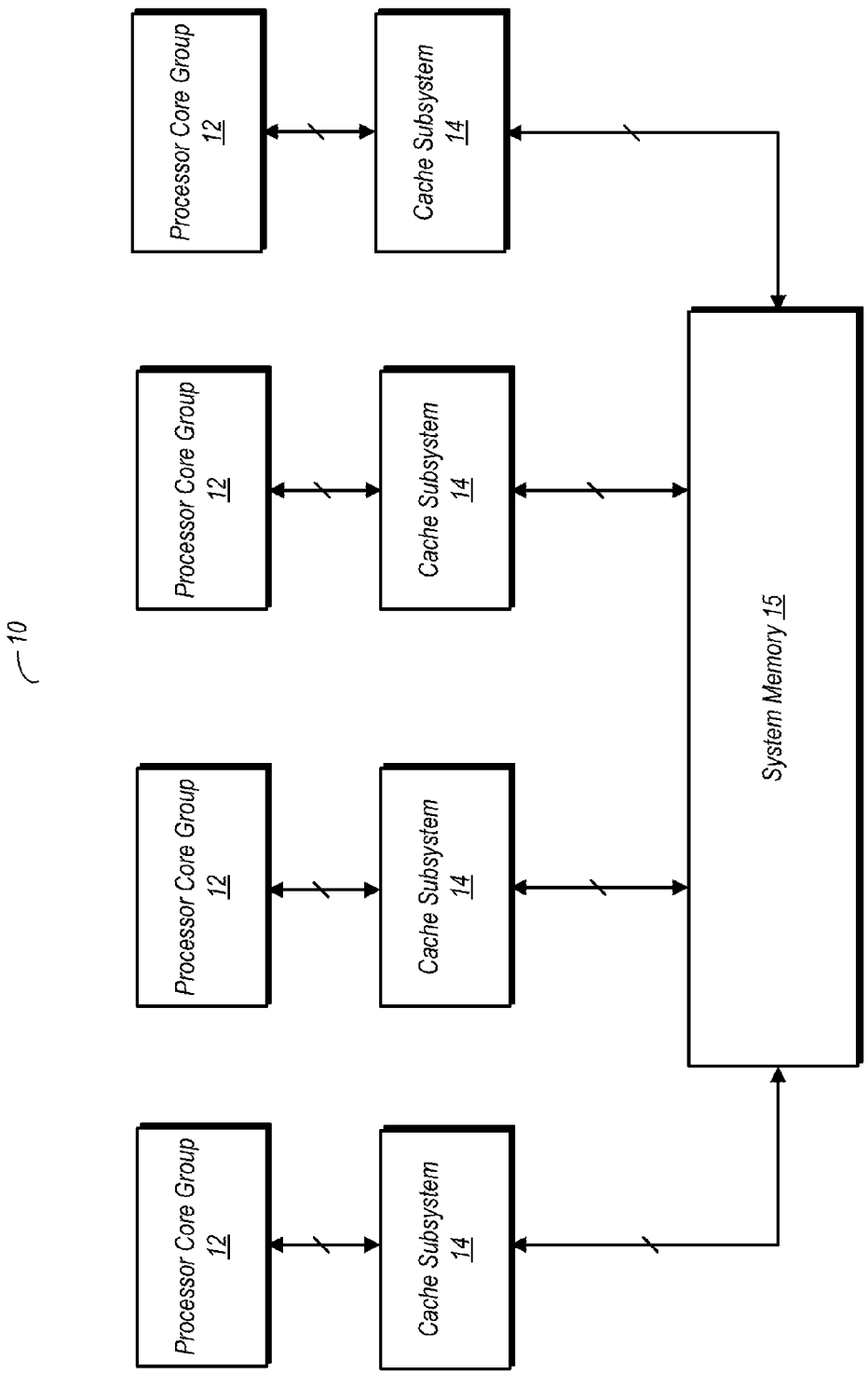
FIG. 1 is a block diagram of one embodiment of a computer system having a multi-core processor.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION

Turning now to FIG. 1, a simplified block diagram of one embodiment of a computer system is shown. In the embodiment shown, system 10 includes a number of processor core groups 12, each of which includes a number of processor cores (an example of which is discussed below). Each of the processor core groups 12 is coupled to a corresponding cache subsystem 14. Each of the cache subsystems 14 includes a cache memory that is shared among the cores of its corresponding processor core group 12. Each of the cache subsystems is coupled to a system memory 15, which in turn is shared among all cores of all processor core groups 12.

Figure 2:
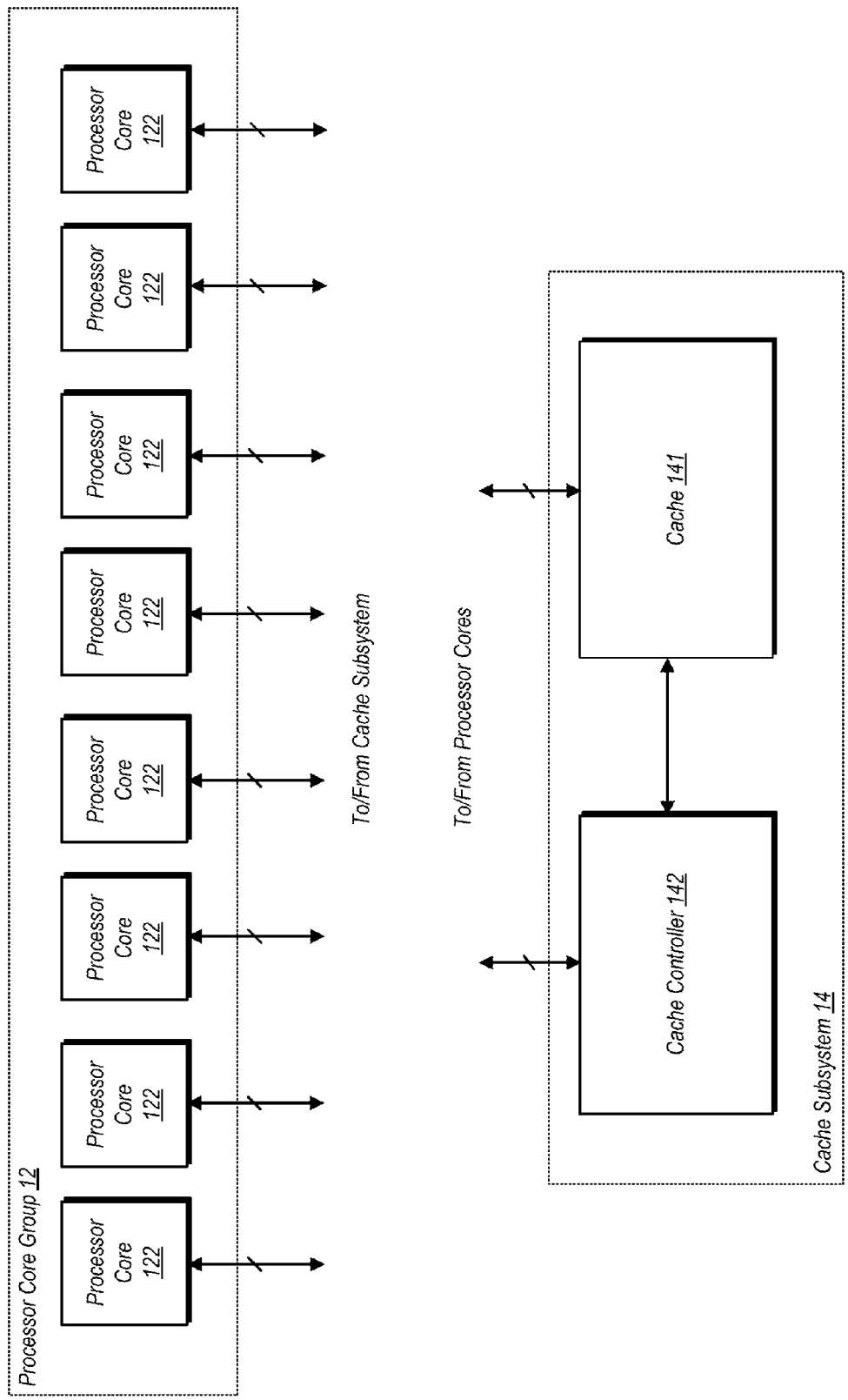
FIG. 2 is a block diagram illustrating one core group and its relationships to other components for one embodiment of a computer system.

FIG. 2 is a simplified block diagram illustrating one embodiment of a processor core group 12 and a correspondingly coupled cache subsystem 14. In this embodiment, processor core group 12 includes eight processor cores 122. Each of the processor cores 122 is coupled to a cache subsystem 14, which includes cache controller 142 and cache 141. In the embodiment shown, cache 141 is a level two (L2) cache that is shared by each of the processor cores 122. Cache 141 may store data and instructions that are frequently and/or recently used by one of the processor cores 122. Each of the processor cores 122 may include at least one level 1 (L1) cache, and may include separate L1 caches for instructions and data. The L2 cache, cache 141, may be partitioned in some embodiments, with each partition being dedicated to one of the processor cores 122.

It is noted that the number of processor cores 122 in each core group 12 shown here is exemplary, and this number can vary from one embodiment to the next. Embodiments are also possible and contemplate in which not all core groups have an equal number of processor cores.

Cache controller 142 in the embodiment shown is configured to perform various functions related to the storage of information in cache 141. These functions include writing information into the cache, evicting information from the cache, snooping the cache responsive to a query for information, invalidating cache lines, marking cached data as dirty responsive to its modification, and so on.

In addition to the functions listed above, cache controller 142 may perform a number of functions in a paging scheme implemented by computer system 10. In particular, each of the processor cores 122 of each of the processor groups 12 may be configured to issue memory requests using only physical addresses. That is, the memory requests are not initiated with a virtual address, nor is there any lookup for a virtual-to-physical address translation in either a translation lookaside buffer (TLB) or a page table. While the capability of virtual addressing may nevertheless be present in computer system 10, certain applications therein may not need any of the translation hardware, and instead may be accessed using physical addressing only. However, a paging scheme may still be useful for such applications that operate based only on physical addresses. The paging scheme may divide the address space of the system memory into pages with flexible sizes and specific properties (e.g., read only, read/write, cacheable, etc.) for each of the pages. The paging scheme may also provide protection and isolation for processes executing on the cores. Cache controller 142 may implement a small amount of extra hardware to enable paging using only physical addresses, thereby eliminating the need, at least for some applications, to provide virtual addresses and to perform translations thereof.

Figure 3:
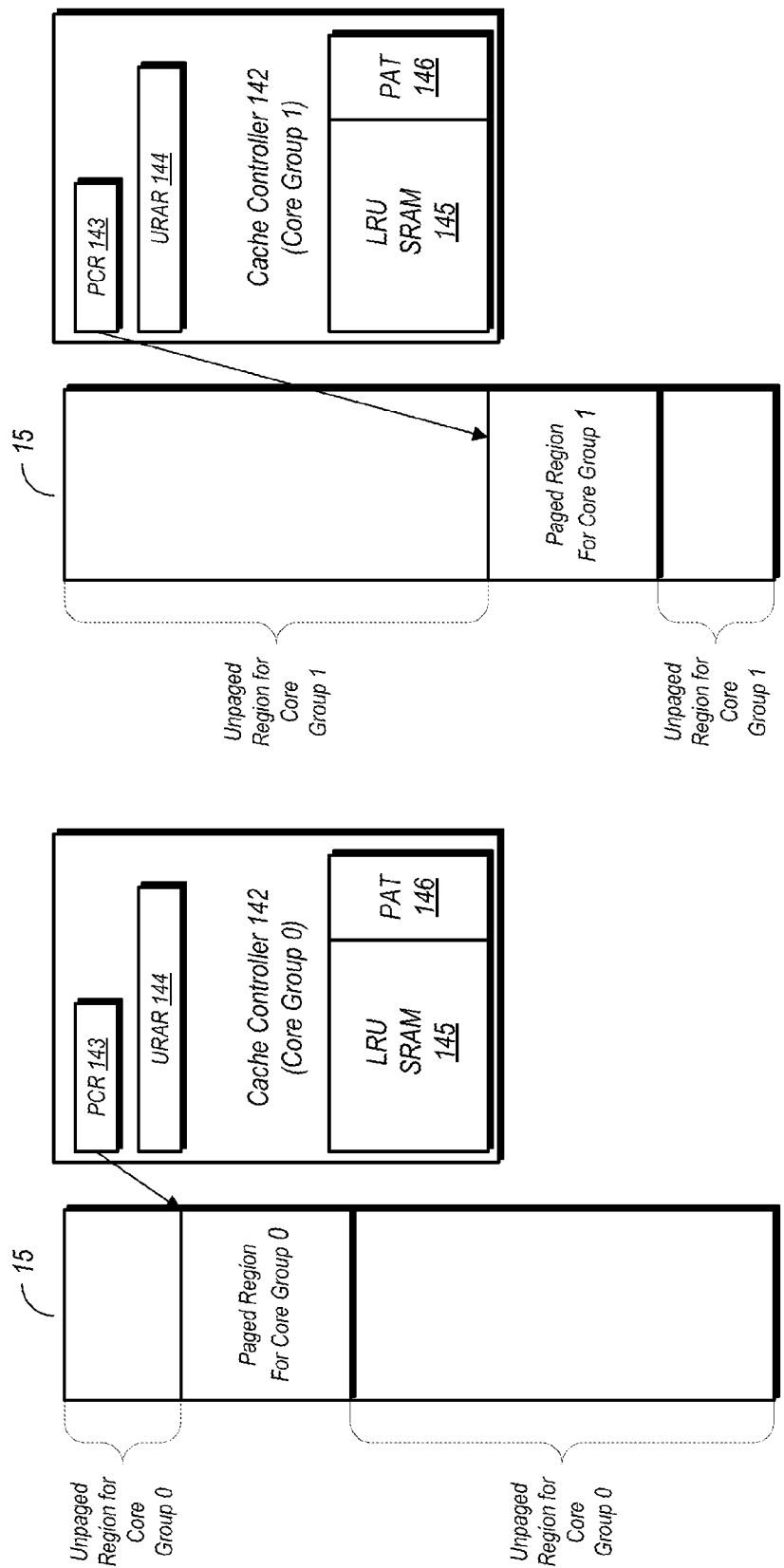
FIGS. 3A and 3B are diagrams illustrating the view of memory for particular groups of processor cores.

FIGS. 3A and 3B are diagrams illustrating the view of memory for particular groups of processor cores. In each of FIGS. 3A and 3B, an embodiment of cache controller 142 is shown. Extra hardware used to implement the paging scheme includes a page configuration register 143, an unpaged region attributes register 144, and a page attributes table (PAT) 146.

For each processor core group, a certain region of system memory 15 is viewed as a paged region, whereas the remaining portion of the memory is viewed as unpaged. The paged region for each core group may be different. For example, FIG. 3A illustrates a first paged region for processor core group 0, while FIG. 3B illustrates a second paged region of system memory 15 for core group 11. The paged regions for core groups 0 and 1 in this example are non-overlapping, and each includes a region of contiguous address. In some embodiments, it is possible that paged regions may overlap one another. However, this is not a requirement, and in many instances, each core group will be assigned to a paged region that is non-overlapping with the paged regions for other core groups.

In the embodiment shown in FIGS. 3A and 3B, each of the cache controllers 142 includes a page configuration register 143. The page configuration register 143 in a given cache controller 142 includes two pieces of information: a start address for the paged region for that core group, and size of the pages within the paged region. In one embodiment, a page configuration register may include 32 bits of information, with 16 bits being dedicated to the start address and the other 16 bits being dedicated to the page size. In some embodiments, the page star address is zero or a power-of-2 multiple of the page size. This is illustrated below in Table 1.

TABLE 1

| Bits | Name | Read/Write | Reset Value | Description |
| --- | --- | --- | --- | --- |
| 15:0 | pg_size | R/W | 0 | Page size = 2**(pg_size) bytes pg_size = 20, specifies pages of 1 MB each. Pg_size = 21, specifies pages of 2 MB each. Pg_size = 27, specifies pages of 128 MB each. |
| 31:16 | pg_start | R/W | 0 | pg_start = 0, sets starting address of paged region = 0, pg_start > 0, start address = (2** pg_start) * (2** pg_size) |

In the embodiment depicted in Table 1, the least significant 16 bits stored in a 32 bit page configuration register 143 store a variable called pg_size. The actual size of the page can be computed as 2 to the power of the pg_size variable ($2^{pg\_size}$), in bits. For example, if pg_size=20, then the pages are 1 megabyte (1,048,576 bytes) each in size. The 16 most significant bits store a variable called pg_start, which is indicative of the start address of the paged region. Thus, as shown in Table 1 above, if the variable pg_start is greater than zero, the start address is 2 to the power of the pg_start variable multiplied by 2 to the power of the pg_size variable ($2^{pg\_start} \times 2^{pg\_size}$).

The size (or more precisely, the number of pages) of the paged region in this embodiment may be defined by the number of words storable in the LRU SRAM 145. PAT 146 may be implemented by adding extra bits to each word in LRU SRAM 144.

For example, if the cache 141 has 4 k lines and is 4-way set-associative, the LRU SRAM has 1 k words. Hence, in the simplest case, the number of pages allowed is 1K. Each word may be extended by 2 bits to store the attributes for a page (thus implementing PAT 146). If the number of pages desired is larger than 1 k, and 2 attributes bits are desired per page, the number of pages can be extended to 2 k, by adding 4 bits to the original LRU word. In general, an implementation of PAT 146 for NK pages is achieved by extending each word by 2 N bits.

As previously noted, PAT 146 stores page attributes for pages in the paged region for a given processor core group. Each page within the paged region for a given core group may have its own set of attributes, and these may be different from other pages in the paged region. Such attributes include (but are not limited to) cacheable, read only, read/write, executable, etc.

Although the embodiment discussed herein uses an extension of LRU SRAM 145 to implement PAT 146, it is noted that this embodiment is not intended to be limiting. Accordingly, embodiments are possible and contemplated in which a page attributes table may be implemented using other structures, such as a dedicated SRAM separate from LRU SRAM 145. In general, any suitable structure may be used to implement PAT 146 while falling within the scope of this disclosure. The use of the LRU SRAM 145, and extension thereof to implement PAT 146, may represent one method of implementing PAT 146 with relatively little overhead.

Unpaged region attributes register (URAR) 144 in the embodiment shown is configured to store attributes for all addresses in the unpaged region as viewed by a given processor core group (i.e. addresses outside that core group's paged region). In contrast to the paged region, each address in the unpaged region as viewed by a given core group may have the same attributes. In one embodiment, URAR 144 may include two bits to indicate attribute for addresses in the unpaged region for a given core group. It is noted that the attributes of an address falling within the unpaged region for a given processor core group may be defined by URAR 144 even if that same address falls within the paged region for another process core group (and thus has different attributes when viewed by that processor core group). Thus, the attributes of the addresses within the paged region for core group 0, when viewed by core group 1, are defined by URAR 144 in the cache controller 142 associated with core group 1. Furthermore, while core group 0 may view each page as having attributes assigned on a page-by-page basis (with at least some pages having different attributes than others within the paged region), core group 1 may view the addresses within this same region as all having an identical set of attributes as defined in its own respective URAR 144.

FIG. 4 is a block diagram illustrating operation of a system utilizing paging for physical addresses. More particularly, FIG. 4 the operational flow of one embodiment of a computer system that uses paging for physical addresses (sans virtual addresses) in terms of structural elements. A number of these structural elements are included in cache controller 142 in the illustrated embodiment, and will be identified as such if not done so previously. Elements that are not in cache controller 142 are also identified with respect to their locations within the system.

Stage 1 of the paging process described herein involves arbitration among co-pending memory access requests. Arbiter 205 in the embodiment shown may be implemented in a cache controller 142, and is coupled to receive memory access requests from each of the cores of a given core group. Additionally, arbiter 205 may receive previously submitted requests that have not fully been satisfied. Arbiter 205 may arbitrate between any co-pending requests using any suitable arbitration scheme. The winning request may be identified by both a core ID as well as by an address. The request may also include information indicating whether it is a read request or a write request.

The address received with the request is a physical address. In the various embodiments discussed herein, the request as generated in the core includes only a physical address but no virtual address. Accordingly, no virtual-to-physical address translation is performed in a TLB for the memory requests discussed herein. However, it is noted that this does not preclude the various processor cores from using virtual addressing for other applications that are not discussed herein. Instead, the applications associate with the requests discussed herein use physical addressing without any virtual addresses or translations between the two address types.

Stage 2 of the paging process involves two different operations. The first of these operations is the determination as to whether the address of the request falls within the paged region for that core group. The second operation performed in stage 2 is the determination of whether the data is stored in the cache.

In the embodiment shown, a cache index, which is a subset of the address, is provided to the tag array, and a tag lookup is performed. All four of the tag arrays shown here (Tag 0-Tag 3) may be selected and read. Using the cache index as a basis, a tag comparison circuit 210 (in cache controller 142) compares tags with a tag that is sought. If the tag is found, tag comparison circuit indicates a cache hit, along with the way in which the data currently resides. Otherwise, no hit indication is generated, and the operation results in a cache miss.

Cache controller 142 includes a PAT index computation circuit 210, which is coupled to receive the physical address, as well as information stored in the PCR 143 and URAR 144. Using the information received from these sources, PAT index computation circuit determines whether the address of the memory request falls within the page region or unpaged region for the associated core group. The PAT index computation circuit 210 may also use information regarding the size of the paged region in making its determination. Using the paged region start address, the size of the paged region, and the request address, a determination can be made by PAT computation index circuit as to whether the request address within the paged region. If the address is in the paged region, PAT index computation circuit 210 in the embodiment shown generated a PAT index which is used to locate the attribute of that page from PAT 146. Otherwise, if the address is in the unpaged region, the attribute stored in URAR 144 are provided.

Stage 3 includes access of data arrays 215 of cache 141 in the event of a cache hit, and also include access of LRU SRAM 145. The access of LRU SRAM 145 may further include access of PAT 146 in the event that the request address is in the paged region.

In the case of a cache hit (read or write hit), the address is provided to the data arrays 215 of cache 141, along with the indication of the hit and the way in which the requested information was found. If the hit is a read hit, the requested data is read from the array. In the case of a write hit, the data associated with the request address is overwritten, and may also be read from the array subsequent to overwriting.

In the embodiment shown, LRU SRAM 145 is a dual-ported SRAM that includes both a read port and a write port. The read and write ports as shown here are each coupled to receive read and write addresses, respectively, from a corresponding multiplexer 230. Although not explicitly shown here, control circuitry configured to select an input of these multiplexers (or inhibit the output thereof) may be included in cache controller 142. Each multiplexer is coupled to receive the PAT index as a first input, and the request address as the second input. Access to the LRU SRAM 145 may be determined based on whether the cache query performed in Stage 2 resulted in a cache hit or a cache miss. Additionally, the data that is read from LRU SRAM 145 or written thereto during a given access may also depend on whether the request address is within the paged region or was otherwise in the unpaged region. Table 2 below illustrates how the two ports are used, and what data is written/read during Stage 3.

TABLE 2

| Operation | Pass | Read-port address | Read data | Write-port address | Write Data |
|---|---|---|---|---|---|
| Read hit | 1 | PAT index | page attributes | Cache index | LRU bits |
| Write hit | 1 | x | x | Cache index | LRU bits, mod bit |
| Read Miss | 1 | Cache index | Mod bits | x | x |
| | 2 or 3 | PAT index | page attributes | Cache index | LRU bits, mod bit |
| Write Miss | 1 | Cache index | Mod bits | x | x |
| | 2 or 3 | x | | Cache index | LRU bits, mod bit |
| PAT Initialize | | x | | PAT index | page attributes |

Operations that involve a read hit or a write hit for the embodiment discussed herein are completed in a single pass. Operations that that involve a write miss or read miss may be performed in two or three passes.

During a read hit, the PAT index is selected as for output from the multiplexer 230 coupled to the read port. The PAT index is provided to LRU SRAM 145, and the page attributes are read from PAT 146. For the multiplexer 230 coupled to the write port, the cache index (i.e. address) is selected responsive to the read hit, and LRU bits are written into LRU SRAM 145.

During a write hit, no address is provided to the read port, nor is any data read therefrom. The cache index is provided to the write port, and LRU bits and a modified bit (indicating that the data has been modified) are written into LRU SRAM 145.

A read miss for the embodiment shown will result in at least two passes. For a read miss, the cache index is provided to the read port on the first pass. The modified bits associated with the cache index may then be read to determine if an eviction from the cache is to be performed. If an eviction is to occur, it may be performed on the second pass. No address is provided to the write port on the first pass of a read miss. On a second or third pass of a read miss, the PAT index is provided as the read port address, and responsive thereto, page attributes are read from the PAT 146. Also on the second or third pass, the cache index is provided as the write port address, and LRU bits and a modified bit may be written to indicate unmodified data being stored in the newly written line.

Responsive to a write miss, the cache index is provided as the address on the first pass, and the modified bit for the data corresponding to the request address is read. This may be used to determine if it is necessary to write back any previously modified data before further modification is performed. No address is provided to the write port on the first pass. On the second or third pass, no address is provided to the read port. However, the cache index is provided to the write port address, and LRU bits and mod bits are written into LRU SRAM 145.

For initialization of PAT 146, no read address is provided to LRU SRAM 145. However, write addresses are provided thereto, and page attributes are written into PAT 146. Thus, when the paged region is defined for a given core group and the page attributes are determined for each page, the address for each page may be provided to LRU SRAM 145 and the corresponding attributes may be written into PAT 146. In some embodiments, if the attributes for a particular page in the paged region are updated, the address for that page may be provided to the write port and the new attributes may then be written into PAT 146.

Stage 4 includes the return of data to the core, queuing of requests that require additional passes (e.g., read misses and write misses), and may also include communication with the memory via a system interface 225 located in cache controller 142.

On a read miss, a read request is sent from system interface 225. After the data has been fetched from memory, it is returned through system interface 225, where it is written into the L2 cache and also returned to the L1 cache of the requesting processor core 122. If the operation involves an eviction from the L2 cache, system interface 225 writes the evicted data back to system memory 15. Page attributes for the requested data, provided from PAT 146 (if in the paged region) or from URAR 144 (if in the unpaged region) are provided back to the requesting core along with the requested data.

Previous request registers 220 in the embodiment shown are configured to provide temporary storage for pending requests. Such requests may be those that are waiting for data from the system and/or waiting for additional passes through the pipeline. The previous request registers 220 may be augmented to store page attributes obtained either from PAT 146 (in the case of transactions occurring in the paged region) or from URAR 144 (in the case of transactions occurring in the unpaged region) so that these attributes can be returned with the data. Additionally, each of the previous request registers 220 is configured to store information regarding the operation being performed (e.g., read, write), the core ID (i.e. the core that initiated the request), the pass (e.g., $2^{nd}$, $3^{rd}$), and the hit/way in the case of a cache hit. The pending requests from previous request registers 220 maybe conveyed through a multiplexer 230 back to the arbiter 205, and may be included in a subsequent arbitration with newly received requests. The selection requests to be conveyed back to arbiter 205 may be performed in various ways. For example, the previous request registers 205 along with the correspondingly coupled multiplexer 230 may behave as a first-in, first-out (FIFO) memory, with the requests being sent back to arbiter 205 in the order that they were received.

The paging scheme described above may offer a power and area savings relative to other addressing schemes that rely on the use of physical addresses without translation from a virtual address. These power and area savings may be realized by sharing PAT 146 among a group of processor cores (instead of providing a separate PAT for each core) and implementing the PAT in an existing SRAM (e.g., LRU SRAM 145) instead of in flops or in a dedicated SRAM. Furthermore, the page index computation may be simplified in various embodiment by restricting the number of pages in the paged region to be a multiple of the number of words in the SRAM that is also used to implement the PAT.

Figure 5:
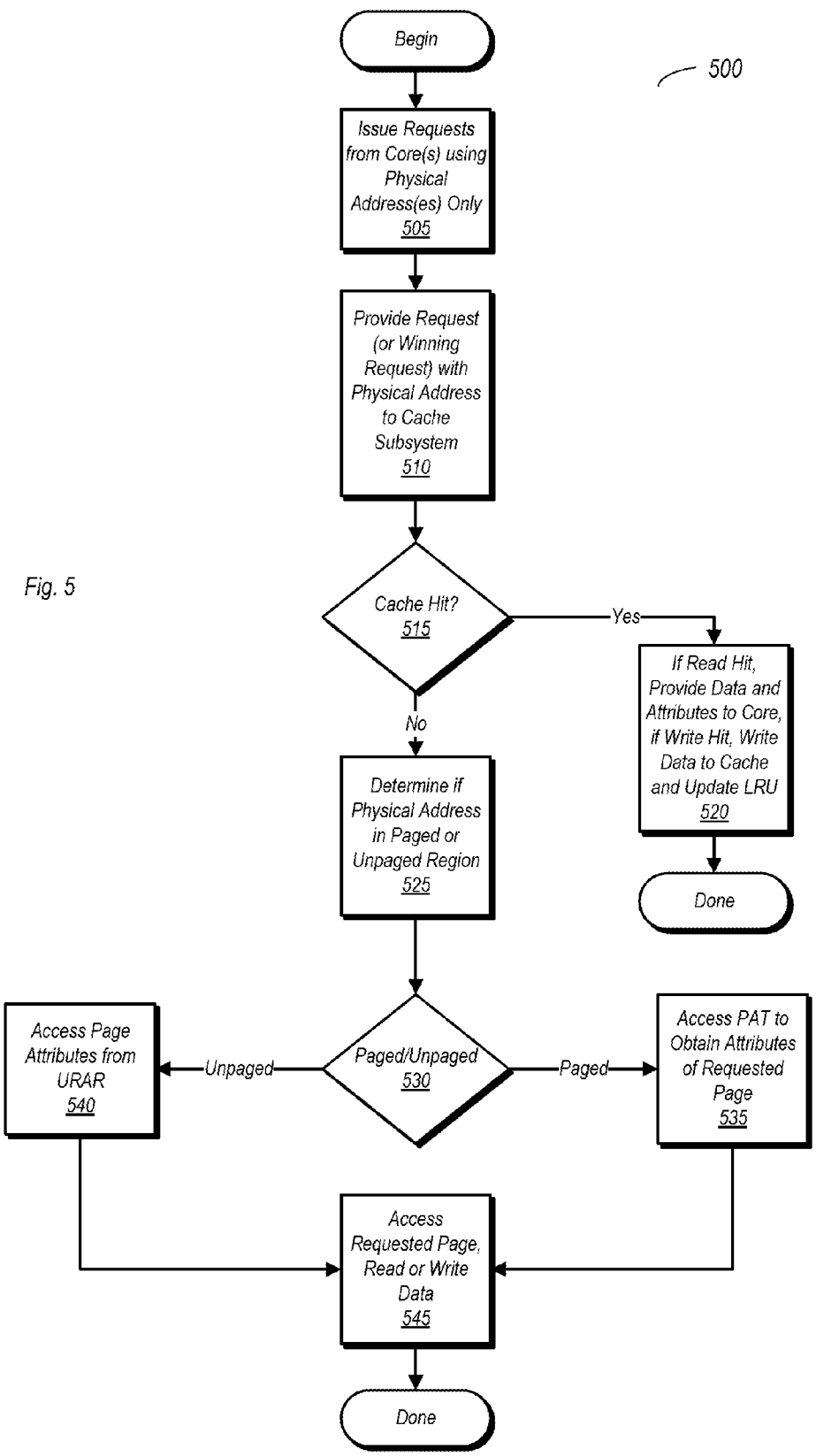
FIG. 5 is a flow diagram illustrating one embodiment of a method for handling requests in a paged memory system in which only physical addresses are used.

Turning now to FIG. 5, a flow diagram of one embodiment of a method for implementing a paging scheme using physical addresses without any corresponding translation from virtual addresses (i.e., the requests originate with physical memory addresses). Method 500 as shown here may be performed with various embodiments of the hardware discussed above and illustrated in FIGS. 1-4. However, it is noted that method 500 is not limited to such hardware, and thus other embodiments capable of performing the method described herein are possible and contemplated.

Method 500 begins with a processor core issuing memory access requests using a physical addresses (block 505)

instead of virtual addresses that requires translation. In various embodiments, the processor cores may be in a group of cores that shares a cache memory, such as an L2 cache. The requests issued may be provided to an arbitration unit, which arbitrates among the pending request and selects a winning request which is conveyed along with the physical address to remainder of the subsystem that includes the shared cache (block 510).

In the cache subsystem, a determination is made as to whether the physical address of the request is cached. A cache hit (block 515, yes) when the requested address is cached. If the hit is a read hit, the data and page attributes are provide to the core, while if the hit is a write hit, the data in the cache line corresponding to the physical address is modified (block 520). The LRU SRAM is also update responsive to either a read or write hit.

If the memory access request does not result in a cache hit, a determination is made as to whether the physical address is in a paged region of memory with respect to the processor core group, or an unpaged region of memory (block 525). If the physical address falls within the paged region (block 530, paged), a page attributes table (PAT) is accessed to obtain attributes of the requested page (block 535). The requested page is then accessed (block 545), with a read or write performed depending on the type of access request. If the requested page is not within the paged region (block 530, unpaged), the attributes corresponding to the address are obtained from the unpaged region attributes register (block 540), which stores a common set of attributes for all addresses falling within the unpaged region. Thereafter, the requested address is accessed, with a read or write being performed per the request type (block 545).

Numerous variations and modifications will become apparent to those skilled in the art once the above disclosure is fully appreciated. It is intended that the following claims be interpreted to embrace all such variations and modifications.

What is claimed is:

1. A computer system comprising:
    a plurality of processor cores each configured to initiate access requests to a system memory by providing a physical address that is not associated with a corresponding virtual address, wherein the plurality of processor cores is subdivided into at least first and second subsets of the plurality of processor cores; and
    wherein the system memory is subdivided into paged and unpaged regions for each of the first and second subsets, wherein a first paged region associated with the first subset is located in an unpaged region with respect to the second subset, and wherein a second paged region associated with the second subset is located in an unpaged region with respect to the first subset;
    a first cache subsystem including a first cache memory, wherein the first cache subsystem is shared by each of the first subset of the plurality of processor cores; and
    wherein, responsive to receiving a memory access request from one of the first subset of the plurality of processor cores, the first cache subsystem is configured to:
        determine if a physical address of the memory access request is in the first paged region; and
        access a set of page attributes for a page corresponding to the physical address from a corresponding page attribute table responsive to determining that the physical address is within the first paged region, wherein the corresponding page attribute table is shared by each of the first subset of the plurality of processor cores.

2. The computer system as recited in claim 1, wherein the cache subsystem is configured to compare the physical address to information stored in a page configuration register to determine if the physical address is in the first paged region corresponding to the first subset of the plurality of processor cores, wherein page configuration register is configured to store a start address for the paged region and information indicating a size of pages in the paged region.

3. The computer system as recited in claim 1, wherein the first cache subsystem is further configured to access an unpaged region attributes register indicating attributes for the region that is unpaged, with respect to the first subset, responsive to determining that the physical address is not within the first paged region.

4. The computer system as recited in claim 1, wherein the cache subsystem includes a memory configured to store the page attribute table, wherein the page attribute table is configured to store page attributes for each page in the first paged region.

5. The computer system as recited in claim 4, wherein the first cache subsystem includes a cache controller having a static random access memory (SRAM) configured to store addresses for least recently used addresses, and wherein the SRAM is further configured to store the page attribute table.

6. The computer system as recited in claim 5, wherein a number of pages in the first paged region is an integer multiple of a number of words storable in the SRAM.

7. The computer system as recited in claim 1, wherein a number of bytes in each page of the first paged region is a power of two.

8. The computer system as recited in claim 1, further comprising:
    a second cache subsystem including a second cache memory, wherein the second cache subsystem is shared by each of the second subset of the plurality of processor cores; and
    wherein, responsive to receiving a memory access request from one of the second subset of the plurality of processor cores, the second cache subsystem is configured to:
        determine if a physical address of the memory access request receive from one of the second subset is in the second paged region; and
        access a set of page attributes for a page corresponding to the physical address from a second page attribute table responsive to determining that the physical address is within the second paged region, wherein the second page attribute table is shared by each of the second subset of the plurality of processor cores.

9. The computer system s recited in claim 8, wherein the second cache subsystem is further configured to access a corresponding unpaged region attributes register indicating attributes for the region that is unpaged, with respect to the second subset, responsive to determining that the physical address of the memory request received from the one of the second subset is not within the second paged region.

10. The computer system as recited in claim 1, wherein the first cache subsystem includes an arbitration unit configured to arbitrate among multiple memory access requests from processor cores of the first subset.

11. A method comprising:
    subdividing a system memory into paged and unpaged regions for a first cache subsystem and a second cache subsystem, wherein a first paged region associated with the first cache subsystem is in an unpaged region with respect to the second cache subsystem, and wherein a second paged region associated with the second cache subsystem is in an unpaged region with respect to the first cache subsystem, wherein the first and second cache subsystems are associated with first and second subsets of a plurality of processor cores, respectively;

a first one of a plurality of processor cores issuing a request for access to the system memory, the first one of the plurality of processor cores being one of the first subset of the plurality of processor cores, wherein issuing the request comprises providing a physical memory address that is not associated with a corresponding virtual address;

determining, in the first cache subsystem, if the physical memory address corresponds to an address within the first paged region of system memory, wherein the first cache subsystem is shared by each processor core of the first subset; and responsive to determining that the physical memory address is in the first paged region, accessing a page attributes table to determine a set of attributes for a page corresponding to the physical memory address, wherein the page attribute table is shared by each processor core of the first subset.

12. The method as recited in claim 11, further comprising accessing an unpaged region attributes register to determine attributes of the unpaged region of system memory, with respect to the first cache subsystem, responsive to determining that the physical address is not in the first paged region.

13. The method as recited in claim 11, wherein determining if the physical memory address corresponds to an address within the first paged region comprises comparing the physical address to information stored in a page configuration register storing information indicating a beginning address of the first paged region and a size of pages in the first paged region.

14. The method as recited in claim 11, further comprising storing the page attribute table in a static random access memory (SRAM) in a cache controller of the first cache subsystem, wherein the SRAM is further used to store information regarding least recently used cache lines stored in a cache of the cache subsystem.

15. The method as recited in claim 14, wherein a number of pages in the first paged region is an integer multiple of a number of words storable in the SRAM, and wherein a number of bytes in each page is a power of two.

16. A system comprising:
a plurality of cache subsystems;
a plurality of processor cores divided into subsets, wherein each of the subsets is coupled to and shares a corresponding unique one of the plurality of cache subsystems, and wherein each of the subsystems includes at least two processor cores; and
a system memory shared by each of the of the plurality of processor cores, wherein each of the plurality of processor cores is configured to assert memory requests using physical addresses that are not associated with corresponding virtual addresses, wherein responsive to a memory request from a given one of the plurality of processors in a first subset, a cache subsystem associated with the first subset is configured to:
determine if a physical address of the memory request is within a region that is a paged region with respect to the subset of the one of the plurality of processors, wherein a paged region for a first subset of processors falls within an unpaged region with respect to a second subset of processors, and wherein a paged region for the second subset of processors falls within an unpaged region with respect to the first subset of processors; and
access page attributes for a page of corresponding to the physical address responsive to determining that the physical address is within the paged region with respect to the subset of the one of the plurality of processors, wherein the page attributes for the paged region are stored in a page attribute table that is shared by each processor core of the subset.

17. The system as recited in claim 16, wherein the cache subsystem associated with each subset is configured to determine if the physical address is in the paged region associated with that subset based on a comparison of the physical address to information stored in a corresponding page configuration register, wherein the page configuration register is configured to store a start address for the paged region associated with that subset and information indicating a size of pages in the paged region associated with that subset.

18. The system as recited in claim 16, wherein the cache subsystem associated with each subset includes a corresponding unpaged region attributes register configured to store information indicating attribute for portions of memory outside the paged region associated with that subset, wherein the cache subsystem associated with the each subset is configured to access the attributes for the portions of memory outside the paged region associated with that subset responsive to determining that the physical address is not within the paged region associated with that subset.

19. The system as recited in claim 16, wherein each of the subsets is associated with a respective paged region in system memory, wherein each address outside the respective paged region for a given subset is considered to be an unpaged region irrespective of whether it includes regions that are considered paged regions with respect to other ones of the subsets.

20. The system as recited in claim 16, wherein the page attribute table of the cache subsystem associated with the each subset is stored in a corresponding static random access memory (SRAM), also used to store the least-recently-used (LRU) bits, wherein a number of pages in the paged region for the each subset is an integer multiple of a number of words storable in the SRAM, and wherein a number of bytes in each page of the paged region is a power of two.

* * * * *

UNITED STATES PATENT AND TRADEMARK OFFICE
CERTIFICATE OF CORRECTION

PATENT NO. : 9,678,872 B2
APPLICATION NO. : 14/598371
DATED : June 13, 2017
INVENTOR(S) : Fernando It is certified that error appears in the above-identified patent and that said Letters Patent is hereby corrected as shown below:

In the Specification

In Column 4, Lines 55-64, delete "For example, if the cache 141 has 4 k lines and is 4-way set-associative, the LRU SRAM has 1 k words. Hence, in the simplest case, the number of pages allowed is 1K. Each word may be extended by 2 bits to store the attributes for a page (thus implementing PAT 146). If the number of pages desired is larger than 1 k, and 2 attributes bits are desired per page, the number of pages can be extended to 2 k, by adding 4 bits to the original LRU word. In general, an implementation of PAT 146 for NK pages is achieved by extending each word by 2 N bits." and insert the same on Column 4, Line 54, as a continuation of the same paragraph.

In Column 7, Line 23, delete "that that" and insert -- that --, therefor.

In the Claims

In Column 10, Line 50, in Claim 9, delete "system s" and insert -- system as --, therefor.

In Column 11, Line 52, in Claim 16, delete "of the of the" and insert -- of the --, therefor.

Signed and Sealed this
Thirty-first Day of July, 2018

Andrei Iancu
*Director of the United States Patent and Trademark Office*